United States Patent
Sel et al.

(10) Patent No.: US 7,795,643 B2
(45) Date of Patent: Sep. 14, 2010

(54) CELL ARRAY OF SEMICONDUCTOR MEMORY DEVICE AND A METHOD OF FORMING THE SAME

(75) Inventors: Jong-Sun Sel, Yongin-si (KR); Jung-Dal Choi, Suwon-si (KR); Chang-Seok Kang, Seongnam-si (KR); Chang-Hyun Lee, Suwon-si (KR); Jang-Sik Lee, Suwon-si (KR); Vie-Na Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 917 days.

(21) Appl. No.: 11/507,511

(22) Filed: Aug. 22, 2006

(65) Prior Publication Data

US 2007/0104011 A1 May 10, 2007

(30) Foreign Application Priority Data

Aug. 22, 2005 (KR) ...................... 10-2005-0076884

(51) Int. Cl.
*H01L 29/94* (2006.01)
(52) U.S. Cl. ...................... 257/202; 257/390; 257/207; 257/208; 257/E27.102
(58) Field of Classification Search ................. 257/202, 257/390, 207, 208, E27.102
See application file for complete search history.

(56) References Cited

U.S. PATENT DOCUMENTS

| | | | | |
|---|---|---|---|---|
| 5,946,548 | A | * | 8/1999 | Hashimoto et al. ............ 438/41 |
| 6,190,968 | B1 | | 2/2001 | Kalnitsky et al. |
| 6,461,916 | B1 | * | 10/2002 | Adachi et al. ................ 438/257 |
| 6,720,610 | B2 | * | 4/2004 | Iguchi et al. ................ 257/315 |
| 7,151,295 | B2 | * | 12/2006 | Yaegashi et al. ............ 257/316 |
| 7,547,943 | B2 | * | 6/2009 | Cho et al. ................... 257/326 |
| 2005/0128806 | A1 | * | 6/2005 | Liou ..................... 365/185.05 |
| 2006/0035437 | A1 | * | 2/2006 | Mitsuhira et al. ........... 438/424 |

FOREIGN PATENT DOCUMENTS

| | | |
|---|---|---|
| KR | 100182869 B1 | 12/1998 |
| KR | 1020010061418 A | 7/2001 |
| KR | 1020040017883 A | 3/2004 |
| KR | 1020050010227 A | 1/2005 |

\* cited by examiner

*Primary Examiner*—Eugene Lee
(74) *Attorney, Agent, or Firm*—Volentine & Whitt PLLC

(57) ABSTRACT

A cell array includes a semiconductor substrate including an active region comprising a first region, a second region, and a transition region, the second region being separated from the first region by the transition region, wherein a top surface of the second region is at a different level than a top surface of the first region. The cell array also includes a plurality of word lines crossing over the first region. The cell array also includes a selection line crossing over the active region, wherein at least a portion of the selection line is located over the transition region.

19 Claims, 10 Drawing Sheets

CELL ARRAY OF SEMICONDUCTOR MEMORY DEVICE AND A METHOD OF FORMING THE SAME

BACKGROUND OF THE INVENTION

1. Field of the Invention

The present invention relates to a semiconductor device and a method of forming the same and, more particularly, to a cell array of a semiconductor memory and a method of forming the same.

A claim of priority is made to Korean Patent Application No. 10-2005-0076884 filed Aug. 22, 2005, in the Korean Intellectual Property Office, the entirety of which is incorporated herein by reference.

2. Description of the Related Art

A semiconductor device may be configured for high density integration by reducing the line widths of word lines and selection lines that are formed on a cell array. Specifically, in NAND semiconductor memory devices, where a plurality of word lines are disposed between the selection lines to constitute a cell string, the line widths of word lines can be reduced. However, the extent to which the line widths of the word lines can be reduced is limited because of limitations in the photolithography process. Moreover, there are factors that would limit the line width reduction of selection lines too. For example, the extent to which the line width of the selection lines forming cell transistors on both sides of the cell string may be reduced is limited because of punch through and leakage current. In particular, the punch through and leakage current may be caused by a short channel effect.

Efforts have been directed to develop methods for reducing the line width of selection lines in a memory cell without reducing the channel length of the selected transistors. One such method involves forming the selected transistors with a recessed channel.

FIG. 1 is a sectional view of a prior art transistor with a recessed channel. Referring to FIG. 1, a gate electrode 26 is formed on a recess region 10r where a portion of a semiconductor substrate 10 is etched, to form a recessed channel. In addition, a gate insulation layer 20 is conformally formed in the recess region 10r. Specifically, the gate electrode 26 is formed on the gate insulation layer 20. Furthermore, a source/drain region 30 is formed in the semiconductor substrate 10 on both sides of the gate electrode 26. Moreover, a channel is formed on a recessed portion of the semiconductor substrate 10, which is disposed on the bottom of the gate electrode 26. Thus, the width of a channel formed along a curvature of the recessed region 10r is wider than that of the gate electrode 26.

As illustrated in FIG. 1, in a conventional transistor with a recessed channel, the center of the recess region 10r is formed on the center of the gate electrode 26, and the gate electrode 26 and the channel of the transistor are formed in a symmetric structure. In this structure, an aspect ratio of the recess region 10r becomes larger when the width of the gate electrode 26 is reduced. Furthermore, in silicon oxide nitric oxide silicon (SONOS) devices having a multi-layer insulation layer formed on the gate insulation layer 20, an aspect ratio of the recess region 10r becomes larger. The large aspect ratio of the recess region 10r may cause the insulation layers to be non-uniformly formed on the center and the edges of the recess region 10r. The non-uniform formation of the insulation layers may change the characteristics of the memory cell.

The present disclosure is directed towards one or more problems associated with the prior art cell array formation methods.

SUMMARY OF THE INVENTION

One aspect of the present disclosure includes a cell array of a semiconductor memory device. The cell array includes a semiconductor substrate including an active region comprising a first region, a second region, and a transition region, the second region being separated from the first region by the transition region, wherein a top surface of the second region is at a different level than a top surface of the first region. The cell array also includes a plurality of word lines crossing over the first region. The cell array also includes a selection line crossing over the active region, wherein at least a portion of the selection line is located over the transition region.

Another aspect of the present disclosure includes a cell array of a semiconductor memory device. The cell array includes a semiconductor substrate including an active region comprising a first region, a second region, and a transition region, the second region being separated from the first region by the transition region, wherein a top surface of the second region is at a different level than a top surface of the first region. The cell array also includes a plurality of word lines crossing over the first region in the active region. The cell array also includes a plurality of selection lines formed on each edge of both sides of the second region to cross over the active region, wherein at least a portion of each of the plurality of selection lines is located over the transition region. The cell array also includes a common source line and a bit line contact pattern formed between adjacent selection lines to be connected to the second region.

Yet another aspect of the present disclosure includes a method of forming a cell array of a semiconductor memory device. The method includes forming a device isolation layer on a semiconductor substrate to define an active region. The method also includes etching a portion of the semiconductor substrate in a predetermined region of the active region to define a first region, a second region, and a transition region, the second region being separated from the first region by the transition region, wherein a top surface of the first region is at a different level than a top surface of the second region. The method also includes forming a plurality of word lines crossing over the first region. The method also includes forming a selection line crossing over the active region, wherein at least a portion of the selection line is located over the transition region.

Another aspect of the present disclosure includes a method of forming a cell array of a semiconductor memory device. The method includes forming a device isolation layer on a semiconductor substrate to define an active region. The method also includes growing an epitaxial layer in a predetermined region of the active region to define a first region, a second region, and a transition region, the second region being separated from the first region by the transition region, wherein a top surface of the first region is at a different level than a top surface of the second region. The method also includes forming a plurality of word lines crossing over the first region. The method also includes forming a selection line crossing over the active region, wherein at least a portion of the selection line is located over the transition region.

BRIEF DESCRIPTION OF THE DRAWINGS

The accompanying drawings, which are included to provide a further understanding of the invention and are incorporated in and constitute a part of this application, illustrate exemplary embodiments of the invention, and together with the description serve to explain the principle of the invention. In the drawings.

DETAILED DESCRIPTION OF THE INVENTION

Figure 1:
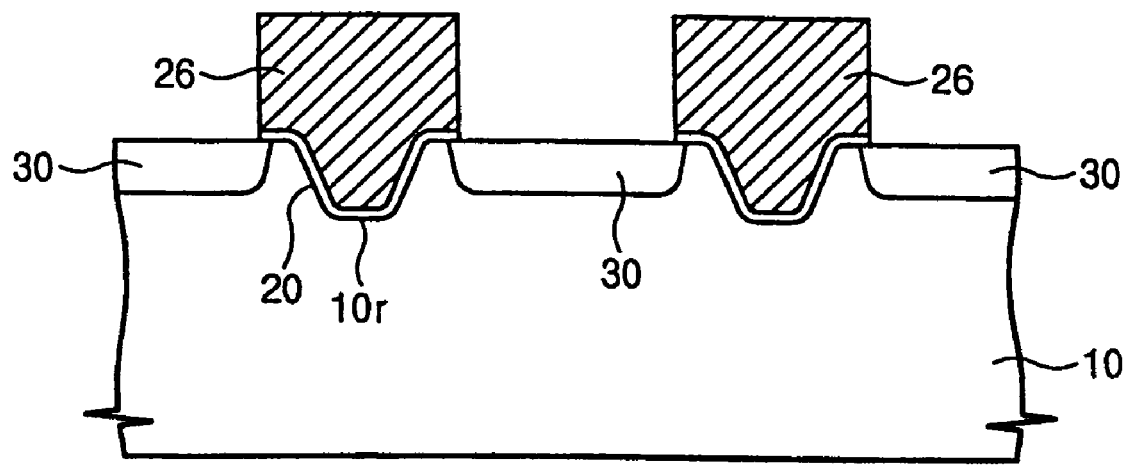
FIG. 1 is a sectional view of a prior art transistor with a recessed channel.

Reference will now be made in detail to exemplary embodiments of the present invention, examples of which are illustrated in the accompanying drawings. However, the present invention is not limited to the embodiments illustrated herein after, and the embodiments herein are rather introduced to provide easy and complete understanding of the scope and spirit of the present invention. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their detailed description will be omitted for conciseness.

Figure 2:
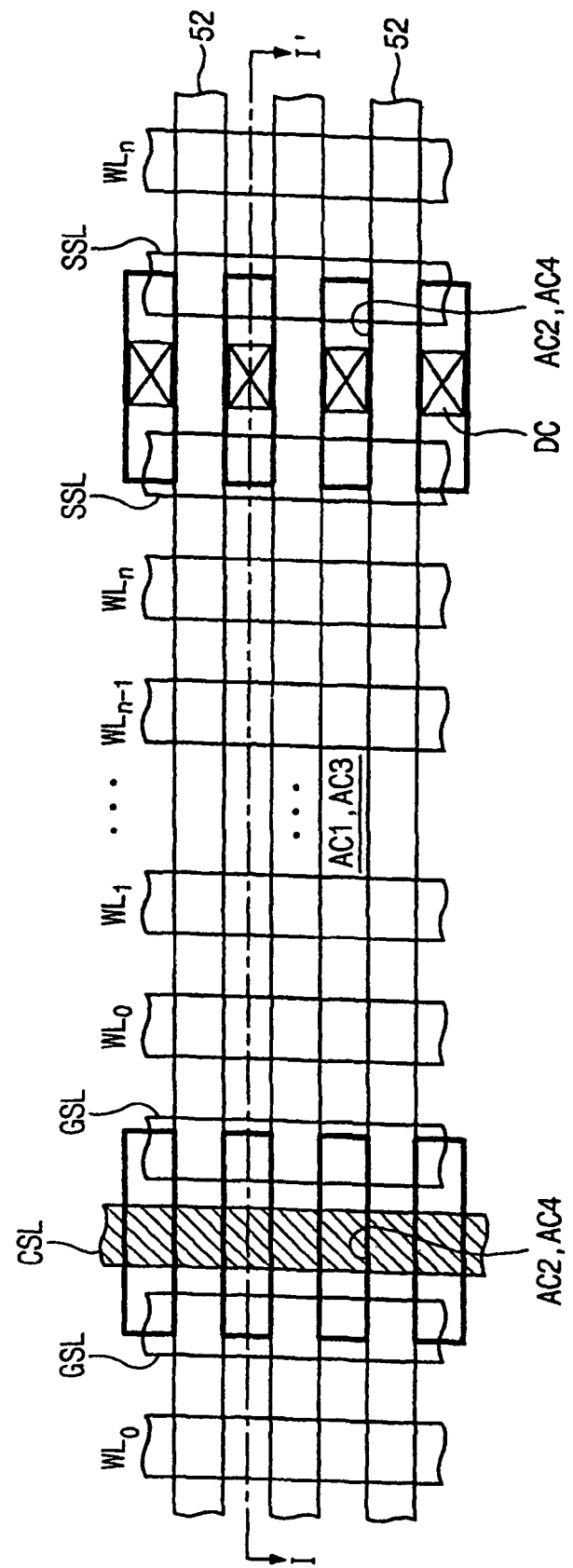
FIG. 2 is a plan view of a cell array in a semiconductor memory device according to an exemplary embodiment of the present invention.

FIG. 2 is a plan view of a cell array in a semiconductor memory device according to an exemplary embodiment of the present invention. Referring to FIG. 2, an active region is defined by forming a device isolation layer 52 on a semiconductor substrate. The active region includes a first region AC1 and AC3. Furthermore, the active region also includes a second region AC2 and AC4 that is adjacent to the first region AC1 and AC3 and may be defined on both sides of the first region AC1 and AC3. In addition, a transition region may be interposed between the first region and the second region to thereby separate the first region from the second first region. Furthermore, a plurality of word lines WLn are formed to cross over the first region AC1 and AC3 of the active region. In addition, selection lines SSL and GSL are formed adjacent to the first region AC1 and AC3 and the second region AC2 and AC4 to cross over the active region and the device isolation layer 52. Furthermore, the selection lines SSL and GSL are formed such that at least a portion of the selection lines is located over the transition region. For example, the selection lines SSL and GSL are formed such that one sidewall of each of the selection lines SSL and GSL is located on the first region AC1 and AC3, and the other sidewall is located on the second region AC2 and AC4. In an exemplary embodiment, the active region is formed on the semiconductor substrate by alternately defining the first region AC1 and AC3 and the second region AC2 and AC4. In addition, the first region AC1 and AC3 on which the word lines WLn are formed occupies space that is larger than that occupied by the second region AC2 and AC4.

The selection lines SSL and GSL are formed on edges of both sides of the second region AC2 and AC4 such that the selection lines SSL and GSL face each other. In particular, the selection lines SSL and GSL can be divided into a string selection line SSL and a ground selection line GSL such that the string selection line SSL faces another string selection line and the ground selection line GSL faces another ground selection line. In addition, a bit line contact pattern DC is connected to the second region AC2 and AC4 between the string selection lines SSL. Furthermore, a common source line CSL is connected to the second region AC2 and AC4 between the ground selection lines GSL.

FIGS. 3 to 6 are sectional views taken along a line I-I' of FIG. 2 of a cell array in a semiconductor memory device according to exemplary embodiments of the present invention.

Figure 3:
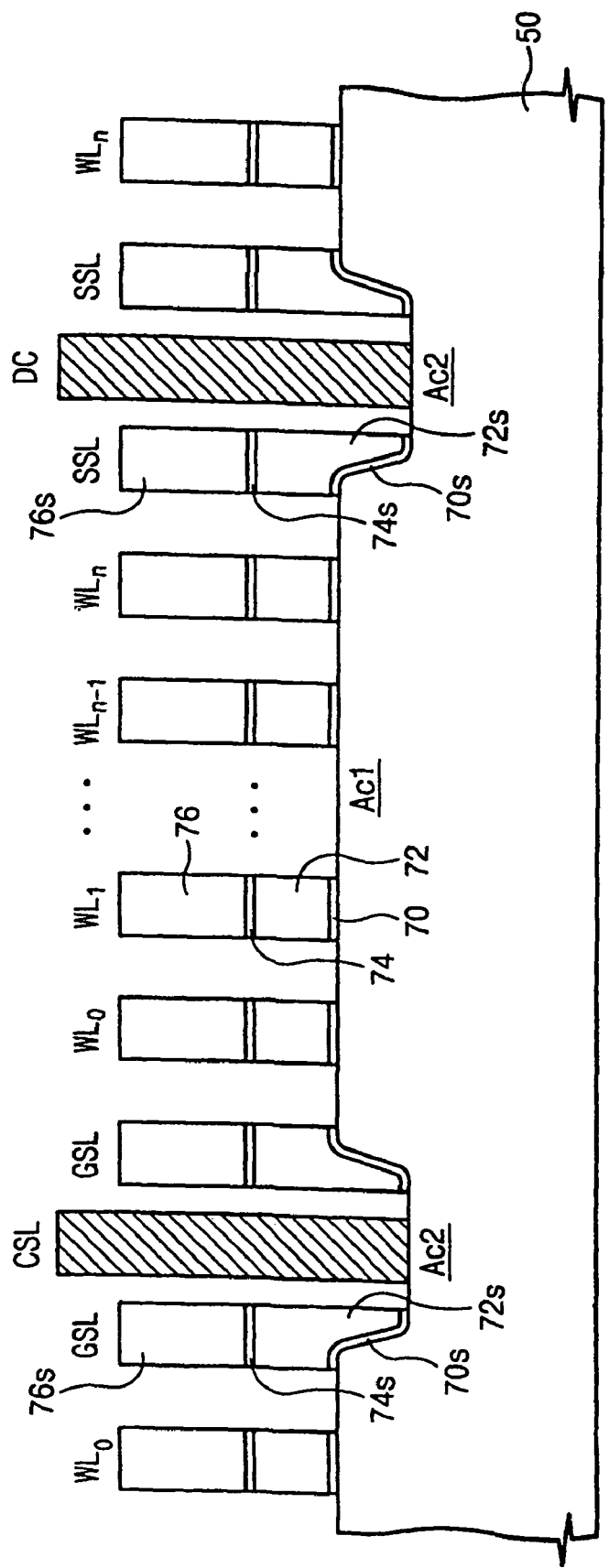
FIGS. 3 to 6 are sectional views taken along a line I-I' of FIG. 2 to illustrate a cell array of a semiconductor memory device according to exemplary embodiments of the present invention.

Referring to FIG. 3, an active region of a cell array according to an exemplary embodiment is divided into a first region AC1 and a second region AC2 defined on a semiconductor substrate 50. The first region AC1 is the region that is substantially planar and at a level different than that of the second region AC2. Likewise, the second region AC2 is the region that is substantially planar and at a different level than that of the first region AC1. Furthermore, a transition region, which is also part of the active region, may separate the second region AC2 from the first region AC1. As shown in FIG. 3, the first region AC1 has a top surface higher than that of the second region AC2. Specifically, the second region AC2 can be formed to be lower than the first region AC1 by etching the semiconductor substrate 50 on which the second region AC2 is formed. In another method, the first region AC1 can be formed to be higher than the second region AC2 by forming a semiconductor layer on the semiconductor substrate 50. For example, the semiconductor layer can be formed using an epitaxial growth method.

The word line WLn on the top of the first region AC1 has a stacked structure in which a tunnel insulation layer 70, a floating gate 72, an inter-gate dielectric layer 74 and a control gate electrode 76 are stacked sequentially. The floating gate 72 is formed on the top of each active region and the control gate electrode 76 crosses over the tops of the active region and the device isolation layer to be formed on a plurality of active regions. Each selection line SSL and GSL is formed such that at least a portion of each selection line is located over the transition region. For example, as shown in FIG. 3, the one sidewall of each selection line SSL and GSL is located on the first region AC1 and the other sidewall is located on the second region AC2. Specifically, the adjacent ground selection lines GSL are formed on each edge of the both sides of the second region AC2 to face each other. Furthermore, the adjacent string selection lines SSL are formed on each edge of the both sides of the second region AC2.

Thus, the selection lines SSL and GSL are continuously formed on the first region AC1 and the second region AC2 with the top surface of each active region AC1 and AC2 being at a different level. Accordingly, when compared with the line widths of the selection lines SSL and GSL, a channel length of the select transistor including the selection lines SSL and GSL can be longer. Additionally, because the selection lines SSL and GSL are formed on the edges of both sides of the second region AC2, the aspect ratio of the second active region AC2 may prevent defects in the formation of a gate insulation layer in the selection lines SSL and GSL.

The selection lines SSL and GSL have a stacked structure. Specifically, the stacked structure of selection lines SSL and GSL includes a bottom selection line 72S, an inter-gate insulation layer 74s, and a top selection line 76s, all of which are sequentially stacked. Furthermore, the bottom selection line 72s and the top selection line 76s cross over the tops of a plurality of active regions. In addition, the bottom selection line 72s is electrically connected to the top selection line 76s. The inter-gate insulation layer 74s is formed between the bottom selection line 72s and the top selection layer 76s.

Even though not illustrated, there may be a portion where the inter-gate insulation layer 74s is not formed between the bottom selection line 72s and the top selection line 76s. For example, the inter-gate insulation layer 74s can be removed in a predetermined region of the semiconductor substrate 50. In addition, the bottom selection line 72s can be electrically connected to the top selection line 76s by removing the inter-gate insulation layer 74s in parallel to a direction of growth of the selection lines SSL and GSL.

The memory cell array of FIG. 3 also includes a common source line CSL. Specifically, the common source line CSL is connected to the second region AC2 between the ground selection lines GSL. In addition, a bit line contact pattern DC is connected to the second region AC2 between the string selection lines SSL.

Figure 4:
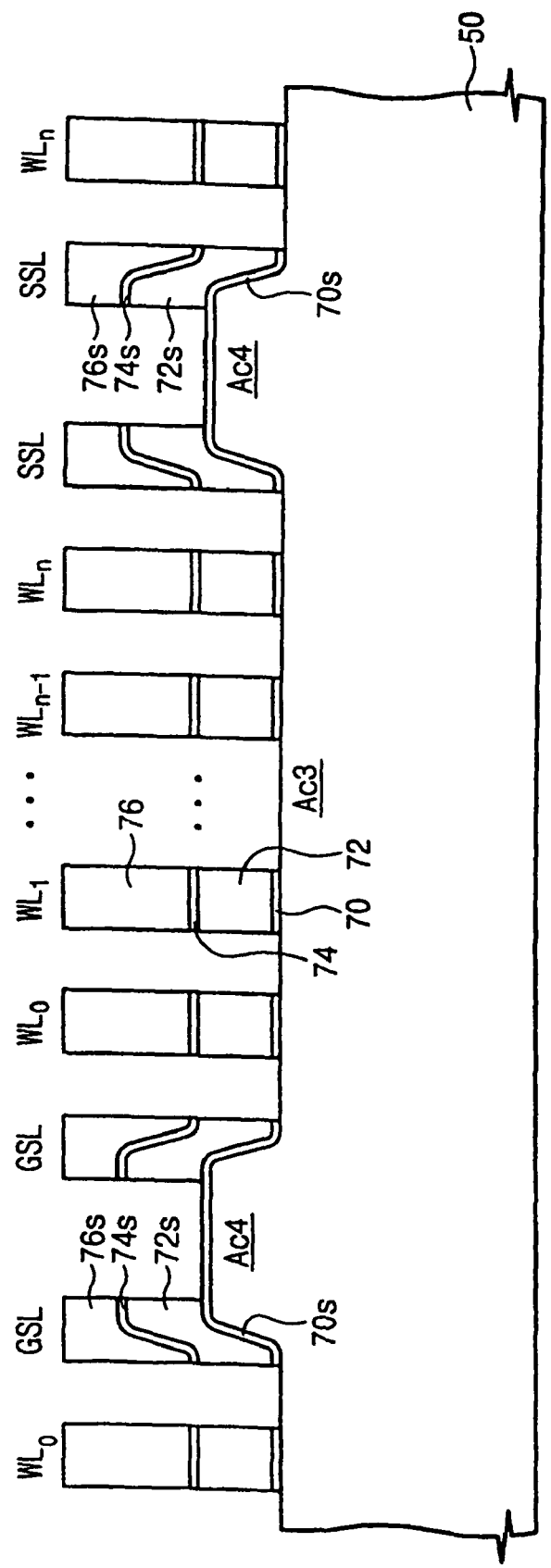

Referring to FIG. 4, an active region of a cell array according to a second exemplary embodiment includes a first region AC3 and a second region AC4. The first region AC3 is the region that is substantially planar and at a level different than that of the second region AC4. Likewise, the second region AC4 is the region that is substantially planar and at a different level than that of the first region AC3. Furthermore, a transition region, which is also part of the active region, may separate the second region AC4 from the first region AC3. As shown in FIG. 4, the second region AC4 has a top surface that is higher than that of the first region AC3. Specifically, the second region AC4 can be formed to be higher than the first region AC3 by forming a semiconductor layer on the semiconductor substrate. On the other hand, the first region AC3 can be formed to be lower than the second region AC4 by etching the semiconductor substrate on which the first region AC3 is to be formed.

In this embodiment, the selection lines SSL and GSL are continuously formed on the first region AC3 and the second region AC4, wherein the top surfaces of the first region AC3 and the second region AC4 are at different levels. Furthermore, each selection line SSL and GSL is formed such that at least a portion of each selection line is located over the transition region. Accordingly, when compared with the line widths of the selection lines SSL and GSL, a channel length of the select transistor including the selection lines SSL and GSL can be longer. Additionally, because the selection lines SSL and GSL are formed on edges of both sides of the second region AC4 whose top surface is at a higher level, a defect in the formation of a gate insulation layer in the selection lines SSL and GSL can be prevented because of the aspect ratio of the second region AC4.

Figure 5:
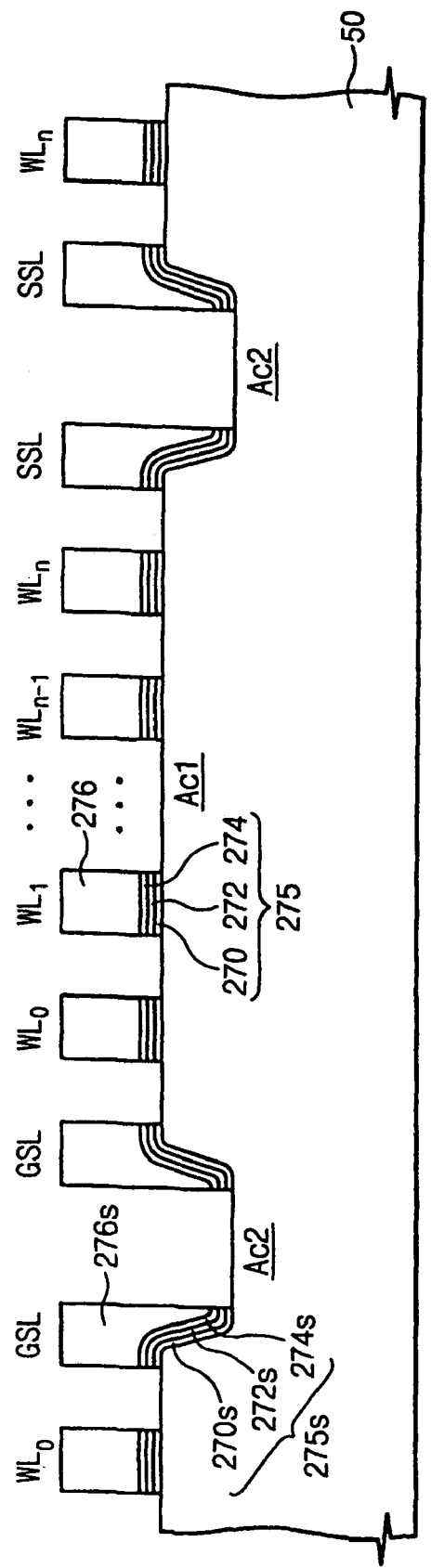

Referring to FIG. 5, a third exemplary embodiment of the present invention is a cell array of a charge trap non-volatile memory device. In this embodiment, a word line WLn includes a multilayered cell gate insulation layer 275 and a cell gate electrode 276. Furthermore, the cell gate electrode 276 is formed on the cell gate insulation layer 275 and crosses over the tops of a plurality of active regions. The cell gate insulation layer 275 is restrictively formed on the top of the active region in the bottom of the cell gate electrode 276, or continuously formed on the active region between the cell gate electrodes 276. In addition, the cell gate insulation layer 275 includes a tunnel insulation layer 270, a charge storage insulation layer 272, and a blocking insulation layer 274, all of which are stacked sequentially.

The select gate lines SSL and GSL include a select gate insulation layer 275s and a select gate electrode 276s. Like the cell gate insulation layer, the select gate insulation layer 275s can include a select tunnel insulation layer 270s, a select charge storage insulation layer 272s, and a select blocking insulation layer 274s. Alternatively, the select gate insulation layer 275s can be formed of a single insulation layer.

A structure of the active region in this embodiment is identical to that of the active region in the first embodiment. Thus, the first region AC1 is the region that is substantially planar and at a level different than that of the second region AC2. Likewise, the second region AC2 is the region that is substantially planar and at a different level than that of the first region AC1. Furthermore, a transition region, which is also part of the active region, may separate the second region AC2 from the first region AC1. Furthermore, each selection line SSL and GSL is formed such that at least a portion of each selection line is located over the transition region. Accordingly, the selection lines SSL and GSL are continuously formed on the first region AC1 and the second region AC2 wherein the top surface of the first region AC1 is at a higher level than that of the second region AC2. Accordingly, when compared with the line widths of the selection lines SSL and GSL, a channel length of the select transistor including the selection lines SSL and GSL can be longer. Additionally, because the selection lines SSL and GSL are formed on edges of both sides of the second region AC2 with the top surface of the first region AC1 being at a higher level, a defect in the formation of a gate insulation layer in the selection lines SSL and GSL can be prevented because of the aspect ratio of the second region AC2.

Figure 6:
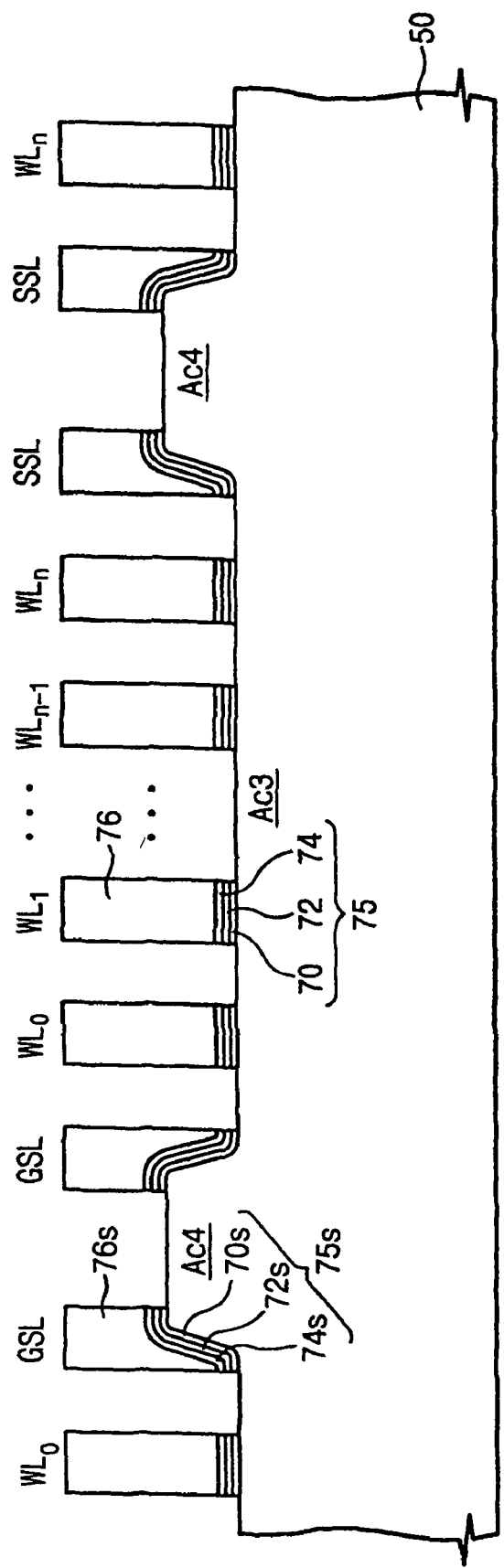

Referring to FIG. 6, a fourth exemplary embodiment of the present invention is a cell array of a charge trap non-volatile memory device having an active region structure identical to that of the second exemplary embodiment. Specifically, the active region of a cell array includes a first region AC3 and a second region AC4 having a top surface higher than that of the first region AC3. Furthermore, the second region AC4 is separated from the first region AC3 by a transition region.

The second region AC4 can be formed to be higher than the first region AC3 by forming a semiconductor layer on the semiconductor substrate 50. On the other hand, the first region AC3 can be recessed to be lower than the second region AC4 by etching the semiconductor substrate on which the first region AC3 is formed.

In this embodiment, the selection lines SSL and GSL are continuously formed on the first region AC3 and the second region AC4 wherein the top surface of one active region is higher than that of the other. Accordingly, when compared with the line widths of the selection lines SSL and GSL, a channel length of the select transistor including the selection lines SSL and GSL can be longer. Additionally, because the selection lines SSL and GSL are formed on edges of both sides of the second region AC4 whose top surface is at a higher level, a defect in the formation of a gate insulation layer in the selection lines SSL and GSL can be prevented because of an aspect ratio of the second region AC4.

Figure 7:
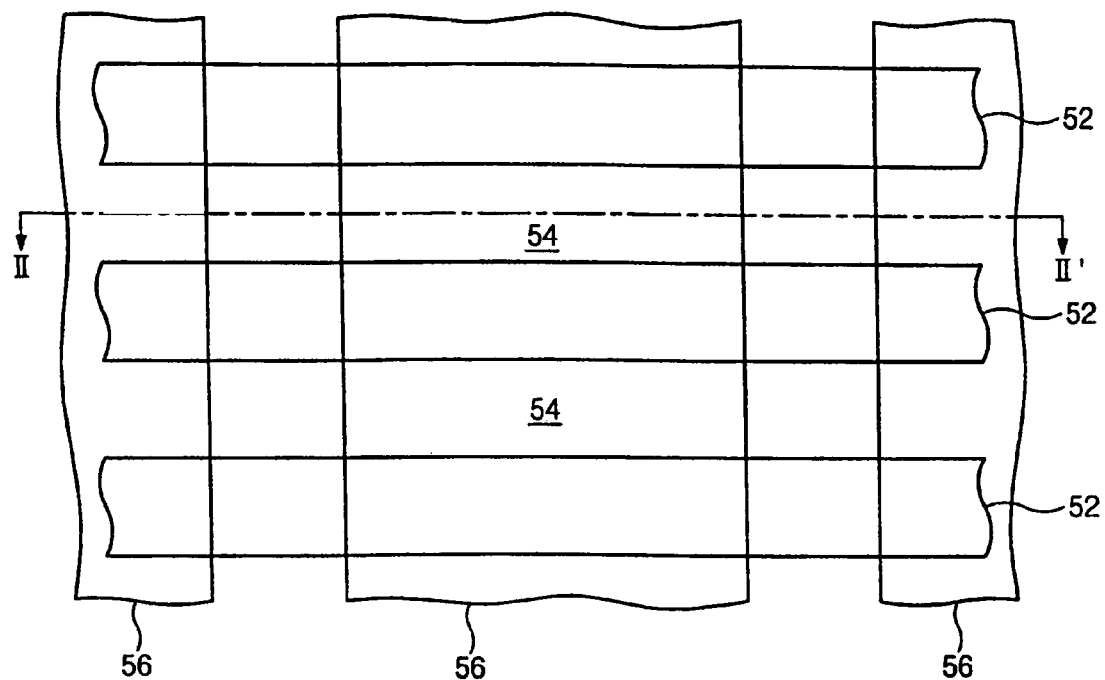
FIGS. 7 to 12 are views illustrating a method of forming a cell array of a semiconductor memory device according to exemplary embodiments of the present invention.
Figure 8A:
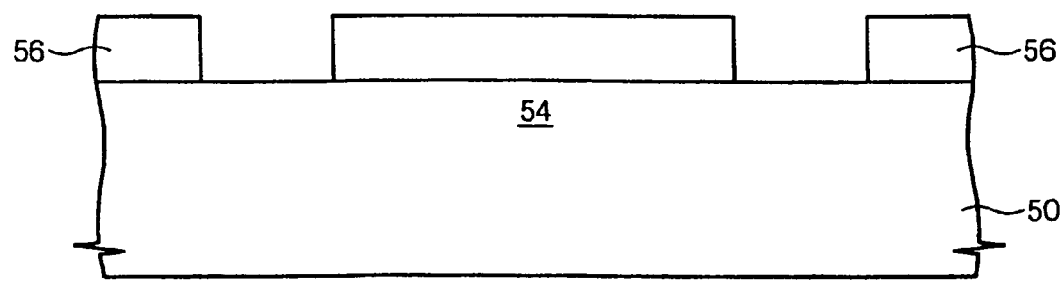
Figure 8B:
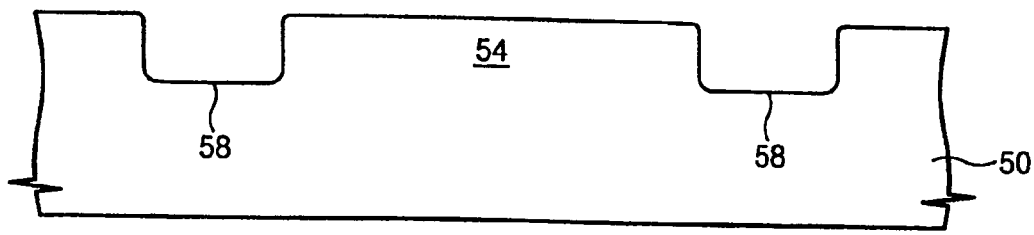

FIGS. 7, 8A and 8B are views illustrating a method of forming an active region according to an exemplary embodiment of the present invention. Specifically, FIGS. 8A and 8B are sectional views taken along a line II-II' of FIG. 7.

Referring to FIGS. 7 and 8A, a device isolation layer 52 is formed on a semiconductor substrate 50 to define an active region 54. Furthermore, a mask layer 56 is formed on the semiconductor substrate 50. The mask layer 56 includes an opening that crosses over the tops of the active region 54 and the device isolation layer 52. In particular, a portion of the active region 54 is exposed in the opening.

Referring to FIG. 8B, the semiconductor substrate 50 of the active region 54 is etched using the mask layer 56 as an etching mask to form a recess region 58. Because of the etching, the top surface of the recess region 58 is lower than that of the active region 54. After the formation of the recess region 58, the semiconductor substrate 50 of the active region 54 is exposed by removing the mask layer 56. The active region, which is protected by the mask layer 56 and thus not etched, corresponds to the first region AC1 and the recess region 58 becomes the second region AC2. As shown in FIG. 8B, the second region AC2 is recessed to be at a lower level than the first region AC1. Thus, the first region AC1 is the region that is substantially planar and at a level different than that of the second region AC2. Likewise, the second region AC2 is the region that is substantially planar and at a different level than that of the first region AC1. Furthermore, a transition region, which is also part of the active region, may separate the second region AC2 from the first region AC1.

Figure 9A:
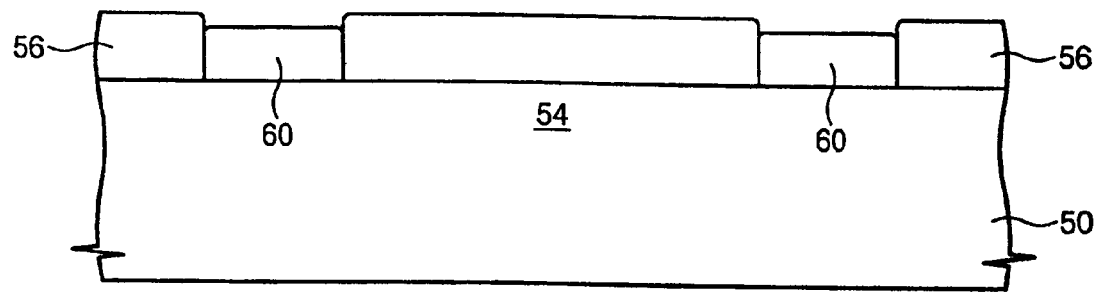
Figure 9B:
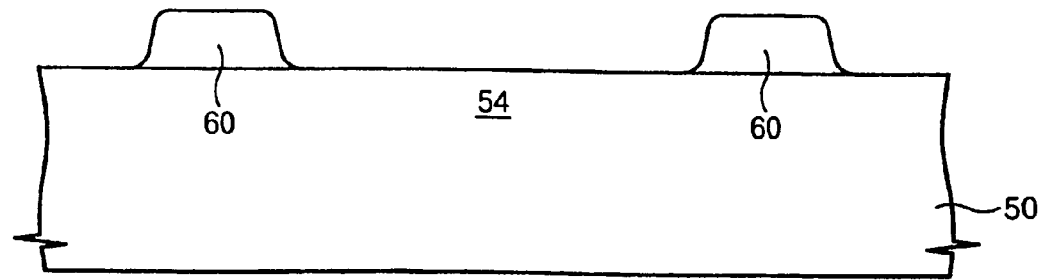

FIGS. 9A and 9B are sectional views taken along a line II-II' of FIG. 7 to illustrate a method of forming an active region in accordance with a second exemplary embodiment.

Referring to FIG. 9A, the mask layer 56 illustrated in FIG. 7 is formed on the semiconductor substrate 50 with a device isolation layer 52. In addition, a semiconductor epitaxial layer 60 is formed on the exposed active region 54 using the mask layer 56 as an epitaxial growth mask layer.

Referring to FIG. 9B, the active region 54 is exposed by removing the mask layer 56. Consequently, the semiconductor epitaxial layer 60 is formed on the active region 54 and has a top surface higher than that of the active region 54. The active region 54 exposing the semiconductor substrate 50 corresponds to the first region AC3 and the semiconductor epitaxial layer 60 becomes the second region AC4 whose top surface is higher than that of the first region AC3. Thus, the first region AC3 is the region that is substantially planar and at a level different than that of the second region AC4. Likewise, the second region AC4 is the region that is substantially planar and at a different level than that of the first region AC3. Furthermore, a transition region, which is also part of the active region, may separate the second region AC4 from the first region AC3.

Figure 10:
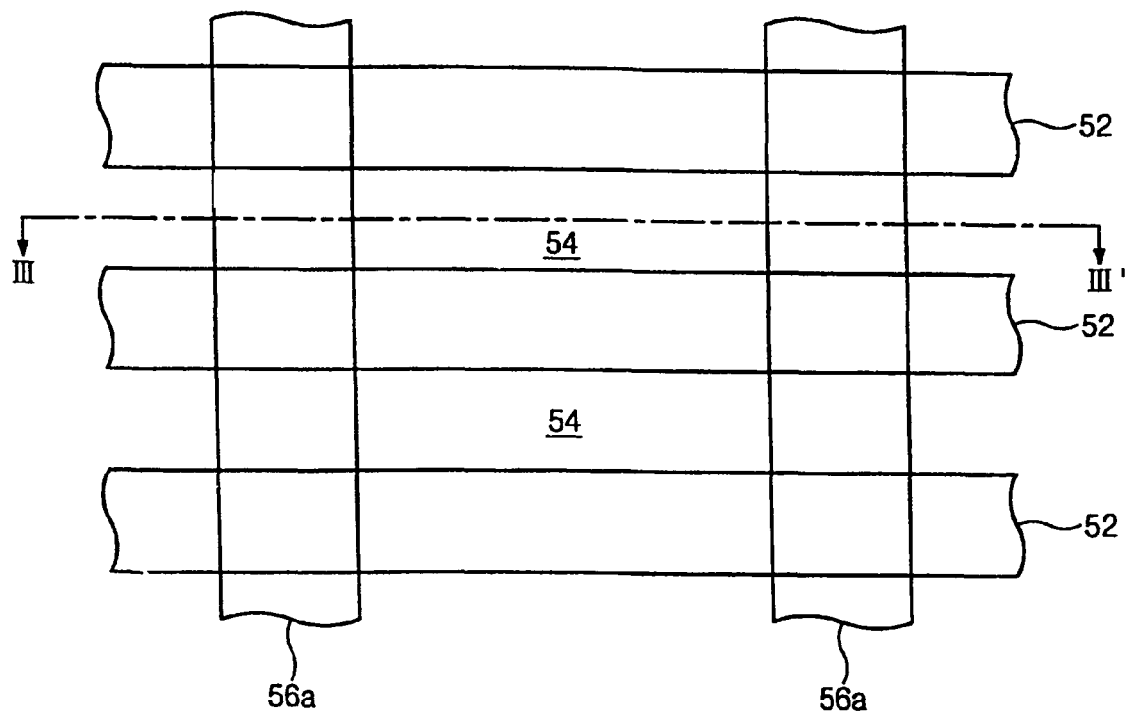
Figure 11A:
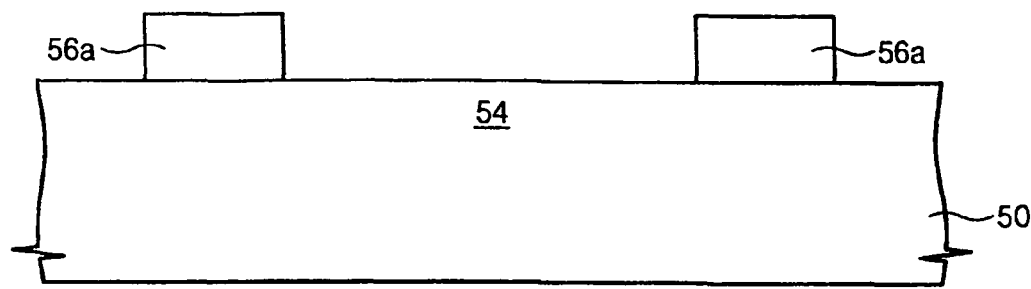
Figure 11B:
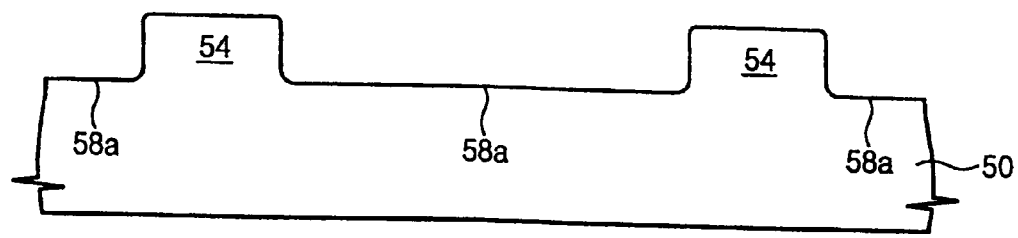

FIGS. 10, 11A and 11B are views illustrating a method of forming an active region of a cell array in accordance with a third exemplary embodiment of the present invention. FIGS. 11A and 11B are sectional views taken along a line III-III' of FIG. 10.

Referring to FIGS. 10 and 11A, a negative mask layer 56a of the mask layer 56 illustrated in FIG. 7, is formed on the semiconductor substrate 50. Furthermore, the active region 54 is defined on the semiconductor substrate 50 by forming the device isolation layer 52.

Referring to FIG. 11B, the semiconductor substrate 50 of the active region 54 is etched to from a recess region 58a by using the mask layer 56a as an etching mask. Consequently, the recess region 58a is formed to have a top surface lower than that of the active region 54. After forming the recess region 58a, the semiconductor substrate 50 of the active region 54 is exposed by removing the mask layer 56a. The recess region 58a is corresponds to the first region AC3 and the active region 54 protected by the mask layer 56a and thus not etched becomes the second region AC4. Thus, the first region AC3 is the region that is substantially planar and at a level different than that of the second region AC4. Likewise, the second region AC4 is the region that is substantially planar and at a different level than that of the first region AC3. Furthermore, a transition region, which is also part of the active region, may separate the second region AC4 from the first region AC3.

Figure 12A:
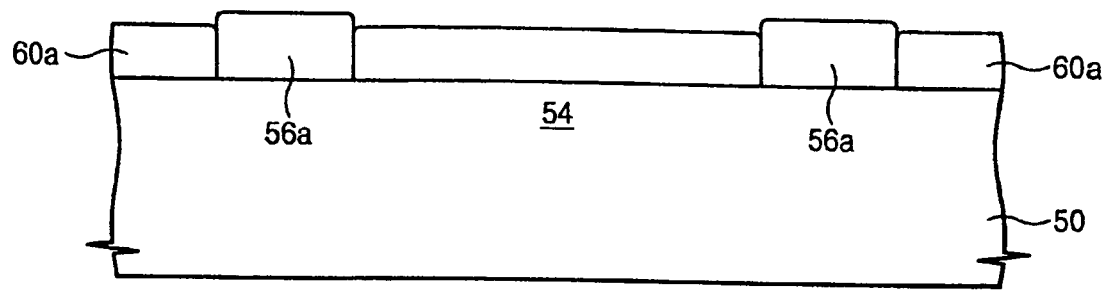
Figure 12B:
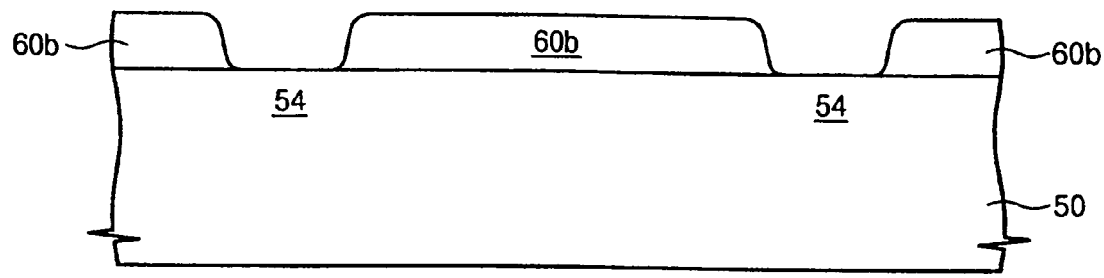

FIGS. 12A and 12B are sectional views taken along a line III-III' of FIG. 10 to illustrate a method of forming an active region of a cell array according to a fourth exemplary embodiment of the present invention.

Referring to FIG. 12A, the mask layer 56a illustrated in FIG. 10 is formed on the semiconductor substrate 50 on which the device isolation layer 52 is formed. Furthermore, an epitaxial layer 60a is formed on the exposed active region 54 using the mask layer 56a as an epitaxial growth mask layer.

Referring to FIG. 12B, the active region is exposed by removing the mask layer 56a. Consequently, a semiconductor epitaxial layer 60b is formed on the active region 54. Furthermore, the semiconductor epitaxial layer 60b has a top surface that is higher than that of the active region 54. The epitaxial layer 60b becomes the first region AC1 and the active region on which the semiconductor substrate 50 is exposed becomes the second region AC2 that has a top surface lower than that of the first region AC1. Thus, the first region AC1 is the region whose top surface is substantially planar and is disposed at a level different than that of the top surface of the second region AC2. Likewise, the second region AC2 is the region whose top surface is substantially planar and at a different level than that of the top surface of the first region AC1. Furthermore, a transition region, which is also part of the active region, may separate the second region AC2 from the first region AC1.

The disclosed memory cell array may be used in any semiconductor device. As described above, a selection line may be formed on an active region whose top surface is at a different level than that of another active region. Thus, the channel length of a select transistor can be longer than the line width of the selection line. Specifically, the selection line is formed on each edge of both sides of a second region that has a top surface which is higher or lower than that of a first region on which a word line is formed. Accordingly, when a cell array is highly integrated, the possibility of an occurrence of a gap fill problem in a gate insulation layer and a gate conductive layer can be significantly reduced when compared to a conventional cell array structure.

It will be apparent to those skilled in the art that various modifications and variations can be made in the present invention. Thus, it is intended that the present invention covers the modifications and variations of this invention provided they come within the scope of the following claims and their equivalents.

What is claimed is:

1. A cell array of a semiconductor memory device, comprising:
   a semiconductor substratum including an active region comprising a first region, a second region, and a transition region interposed between the first region and the second region,
   wherein the first region has a substantially planar top surface, the second region has a substantially planar top surface, the top surface of the second region is disposed at a different level than the top surface of the first region, and the transition region has a top surface that is inclined relative to each of the top surfaces of the first and second regions;
   a plurality of word lines crossing over the top surface of the first region; and
   a selection line crossing over the active region, at least a portion of the selection line being located over the inclined top surface of the transition region, and
   wherein the selection line has opposite sidewalls, one of the sidewalls extending upright on the top surface of one of said regions of the active region, the other of the sidewalls extending upright on the top surface of another of said regions of the active region, and the sidewalls having different vertical dimensions such that one of the sidewalls is taller than the other.

2. The cell array of claim 1, wherein the top surface of the first region is lower than the top surface of the second region.

3. The cell array of claim 2, wherein the substratum comprises a semiconductor substrate and a layer of semiconductor material disposed on a portion of the substrate, the top surface of the first region is an upper surface of the semiconductor substrate and the top surface of the second region is an upper surface of the semiconductor layer.

4. The cell array of claim 2, wherein the semiconductor substratum is a semiconductor substrate, and the first region is a region at which the semiconductor substrate is recessed such that the top surface thereof is lower than the top surface of the second region.

5. The cell array of claim 1, wherein the top surface of the first region is higher than the top surface of the second region.

6. The cell array of claim 5, wherein the substratum comprises a semiconductor substrate and a layer of semiconductor material disposed on a portion of the substrate, the top surface of the first region is an upper surface of the semiconductor layer and the top surface of the second region is an upper surface of the semiconductor substrate.

7. The cell array of claim 5, wherein the semiconductor substratum is a semiconductor substrate, and the second region is a region at which the semiconductor substrate is recessed such that the top surface thereof is lower than the top surface of the first region.

8. The cell array of claim 1, wherein the word line comprises:
a tunnel insulation layer formed on the active region;
a floating gate formed on the tunnel insulation layer;
a control gate electrode formed on the floating gate to cross over the active region; and
an inter-gate dielectric layer interposed between the floating gate and the control gate electrode.

9. The cell array of claim 8, wherein the selection line comprises:
a gate insulation layer formed on the active region;
a bottom selection line formed on the gate insulation layer to cross over the active region;
a top selection line formed on the bottom selection line to cross over the active region and electrically connected to the bottom selection line; and
an inter-gate insulation layer interposed between the bottom selection line and the top selection line.

10. The cell array of claim 1, wherein the word line comprises:
a cell gate insulation layer formed on the active region, the cell gate insulation layer including a tunnel insulation layer, a charge trap insulation layer, and a blocking insulation layer, which are stacked sequentially; and
a cell gate electrode formed on the cell gate insulation layer to cross over the active region.

11. The cell array of claim 1, wherein one of the sidewalls of the selection line extends upright on the top surface of the first region and the other of the sidewalls extends upright on the top surface of the second region.

12. A cell array of a semiconductor memory device, comprising:
a semiconductor substratum including an active region comprising a first region, a second region, and a transition region interposed between the first region and the second region,
wherein the first region has a substantially planar top surface, the second region has a substantially planar top surface segments of which are disposed on opposite sides of the top surface of the first region, the top surface of the second region is disposed at a different level than the top surface of the first region, and the transition region has a top surface, each of the segments of the top surface of the transition region being interposed between the top surface of the first region and a respective one of the segments of the top surface of the second region, and each of the segments of the top surface of the transition region being inclined relative to each of the top surfaces of the first and second regions;
a plurality of word lines crossing over the top surface of the first region of the active region;
a plurality of selection lines crossing over the active region at sides of the segments of the top surface of the second region, respectively, at least a portion of each selection line being located over a respective segment of the top surface of the transition region, and
wherein each selection line has opposite sidewalls, one of the sidewalls extending upright on the top surface of one of said regions of the active region, the other of the sidewalls extending upright on the top surface of another of said regions of the active region, and the sidewalls of the selection line having different vertical dimensions such that one of the sidewalls is taller than the other; and
a common source line and a bit line contact pattern disposed between adjacent selection lines on and connected to the second region.

13. The cell array of claim 12, wherein the top surface of the first region is lower than the top surface of the second region.

14. The cell array of claim 13, wherein the substratum comprises a semiconductor substrate and a layer of semiconductor material disposed on a portion of the substrate, the top surface of the first region is an upper surface of the semiconductor substrate and the top surface of the second region is an upper surface of the semiconductor layer.

15. The cell array of claim 13, wherein the semiconductor substratum is a semiconductor substrate, and the first region is a region at which the semiconductor substrate is recessed such that the top surface thereof is lower than the top surface of the second region.

16. The cell array of claim 12, wherein the top surface of the first region is higher than the top surface of the second region.

17. The cell array of claim 16, wherein the substratum comprises a semiconductor substrate and a layer of semiconductor material disposed on a portion of the substrate, the top surface of the first region is an upper surface of the semiconductor layer and the top surface of the second region is an upper surface of the semiconductor substrate.

18. The cell array of claim 16, wherein the semiconductor substratum is a semiconductor substrate, and the second region is a region at which the semiconductor substrate is recessed such that the top surface thereof is lower than the top surface of the first region.

19. The cell array of claim 12, wherein one of the sidewalls of each selection line extends upright on the top surface of the first region and the other of the sidewalls of the selection line extends upright on the top surface of the second region.

* * * * *